United States Patent
Li

(10) Patent No.: US 9,911,832 B2
(45) Date of Patent: Mar. 6, 2018

(54) METHOD TO IMPROVE GATE DIELECTRIC QUALITY FOR FINFET

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/236,331

(22) Filed: Aug. 12, 2016

(65) Prior Publication Data

US 2017/0200809 A1    Jul. 13, 2017

(30) Foreign Application Priority Data

Jan. 13, 2016 (CN) .......................... 2016 1 0018952

(51) Int. Cl.
*H01L 21/8234* (2006.01)
*H01L 29/66* (2006.01)
(Continued)

(52) U.S. Cl.
CPC ...... *H01L 29/66795* (2013.01); *H01L 21/265* (2013.01); *H01L 21/3085* (2013.01);
(Continued)

(58) Field of Classification Search
CPC ............. H01L 29/66795; H01L 29/785; H01L 21/3085; H01L 29/0649; H01L 21/265;
(Continued)

(56) References Cited

U.S. PATENT DOCUMENTS

2008/0054361 A1* 3/2008 Siprak ............... H01L 21/845
257/365
2010/0048005 A1 2/2010 Seebauer
(Continued)

OTHER PUBLICATIONS

European Application No. 17150927.6, Extended European Search Report dated May 16, 2017, 7 pages.

*Primary Examiner* — Bitew Dinke
(74) *Attorney, Agent, or Firm* — Kilpatrick Townsend & Stockton LLP

(57) ABSTRACT

A method for manufacturing a semiconductor device includes providing a substrate structure comprising a substrate, a plurality of fins on the substrate and a hardmask on the fins, forming an insulating layer on the substrate structure covering the fins and the hardmask, removing a portion of the insulating layer by etching to expose the hardmask, removing the hardmask, and performing a fluorine ion implantation into a top portion of the fins. The implanted fluorine ions passivate dangling bonds in the top portion of the fins, thereby improving the reliability of the semiconductor device.

10 Claims, 9 Drawing Sheets

(51) Int. Cl.
  *H01L 29/78* (2006.01)
  *H01L 21/308* (2006.01)
  *H01L 21/306* (2006.01)
  *H01L 21/265* (2006.01)
  *H01L 29/36* (2006.01)
  *H01L 29/06* (2006.01)

(52) U.S. Cl.
  CPC .. *H01L 21/30604* (2013.01); *H01L 21/30625* (2013.01); *H01L 29/0649* (2013.01); *H01L 29/36* (2013.01); *H01L 29/785* (2013.01)

(58) Field of Classification Search
  CPC ............... H01L 21/30625; H01L 29/36; H01L 21/30604; H01L 21/823431; H01L 21/823821; H01L 21/845
  See application file for complete search history.

(56) References Cited

U.S. PATENT DOCUMENTS

| | | | |
|---|---|---|---|
| 2013/0214360 A1 | 8/2013 | Siprak | |
| 2013/0270641 A1* | 10/2013 | Chi | H01L 21/823821 257/351 |
| 2014/0264634 A1 | 9/2014 | Lee | |
| 2016/0056293 A1* | 2/2016 | Yeh | H01L 29/66795 257/411 |
| 2016/0204039 A1* | 7/2016 | Togo | H01L 21/823814 257/369 |
| 2016/0247805 A1* | 8/2016 | Basker | H01L 21/823814 |
| 2016/0322348 A1* | 11/2016 | Wu | H01L 21/845 |
| 2016/0358911 A1* | 12/2016 | Chen | H01L 27/0886 |
| 2016/0358912 A1* | 12/2016 | Chen | H01L 27/0886 |
| 2017/0053941 A1* | 2/2017 | Basker | H01L 27/1211 |

* cited by examiner

METHOD TO IMPROVE GATE DIELECTRIC QUALITY FOR FINFET

CROSS-REFERENCES TO RELATED APPLICATIONS

This application claims priority to Chinese patent application No. 201610018952.5, filed on Jan. 13, 2016, the content of which is incorporated herein by reference in its entirety.

BACKGROUND OF THE INVENTION

The present invention relates generally to semiconductor technology. Specifically, embodiments of the invention are directed to semiconductor device structures and a method of manufacturing the same.

As the feature size of metal oxide semiconductor field-effect transistors (MOSFETs) continues to decrease, short channel effects have become a critical design issue due to the reduction in the size of the gate length. Fin Field-effect transistor (FinFET) devices exhibit excellent gate controllability on channel charge, superior electrostatic control capability, higher drive current and lower power consumption, so that the feature size of complementary metal oxide semiconductor (CMOS) devices can be further reduced to increase the integration density in accordance with Moore's Law.

However, strong electric fields in the proximity of the top corners of the fin may adversely affect gate dielectric integrity, time-dependent dielectric breakdown, negative bias temperature instability and positive bias temperature instability of a FinFET device. Thus, the strength of electric fields at the top corners of the fin may impact the reliability and performance of a FinFET device.

Currently, rounding the corners of the fin is the main technique to improve the reliability of a FinFET device. This technique appears to be effective for core FinFET devices, however, it is less effective for input/output (I/O) FinFET devices.

The present inventor has discovered that, in the conventional method of forming a FinFET device, the filler material disposed between the fins may be removed by etching, causing impurities to migrate into the channel region, thereby reducing the FinFET performance.

Thus, there is a need to provide a novel fin-type semiconductor device and manufacturing method thereof to overcome the above-described problems.

BRIEF SUMMARY OF THE INVENTION

The present inventor has discovered that the reliability of a FinFET device can be improved by performing a fluorine ion implantation into the top portion of the fin. The novel method of introducing fluorine ions into the fin of a FinFET device results in an improvement in gate dielectric integrity, time-dependent dielectric breakdown, negative bias temperature instability and positive bias temperature instability of the FinFET device.

Embodiments of the present invention provide a method for manufacturing a fin-type semiconductor device having improved reliability and performance. The method includes providing a substrate structure comprising a substrate, a plurality of fins on the substrate, and a hardmask layer on the fins. The method further includes forming an insulating layer on the substrate structure covering the fins and the hardmask, removing a portion of the insulating layer by etching to expose the hardmask, removing the hardmask, and performing a fluorine ion implantation into a top portion of the fins.

In one embodiment, the fluorine ion implantation includes implanting fluorine ions at an energy in a range between 2 KeV and 10 KeV using a dose in a range between $1\times10^{13}$ and $1\times10^{15}$ atoms/cm$^2$.

In one embodiment, the plurality of fins includes a first fin being a portion of a core device and a second fin being a portion of an I/O device.

In one embodiment, the method further includes, after the fluorine ion implantation, forming a recess in the insulating layer to expose a portion of the first fin and a portion of the second fin.

In one embodiment, the method also includes forming a first gate structure surrounding the exposed portion of the first fin and a second gate structure surrounding the exposed portion of the second fin. The first gate structure includes a first gate insulating material on the exposed portion of the first fin and a first gate on the first gate insulating material. The second gate structure includes a second gate insulating material on the exposed portion of the second fin and a second gate on the second gate insulating material.

In one embodiment, the method also includes forming an interlayer dielectric layer surrounding the first and second gate structures, performing a chemical physical polishing process on the interlayer dielectric layer to expose a surface of the first and second gate structures, removing the first gate and the second gate, forming a patterned mask on the second gate structure while exposing the first gate insulating material on the first fin, removing the first gate insulating material to expose a surface of the first fin, removing the patterned mask, and forming a third dielectric material on the exposed surface of the first fin and on the second gate insulating material of the second fin.

In one embodiment, forming the third dielectric material includes forming an interfacial layer on the exposed surface of the first fin, and forming a high-k dielectric layer on the interface layer of the first fin and on second gate insulating material of the second fin.

Embodiments of the present invention also provide a semiconductor device. The semiconductor device includes a substrate structure having a substrate and a plurality of fins on the substrate. The fins each include a fluorine-doped top portion. The fluorine-doped top portion has a depth less than 3 nm and a dopant concentration in a range between $1\times10^{17}$ and $1\times10^{21}$ atoms/cm$^3$.

In one embodiment, the plurality of fins includes a first fin being a portion of a core device and a second fin being a portion of an I/O device.

In one embodiment, the semiconductor device further includes a second gate insulating material surrounding an exposed portion of the second device, and a third gate insulating material surrounding an exposed portion of the first fin and the second gate insulating material. The third gate insulating material may include an interfacial layer on the exposed portion of the first fin, and a high-k dielectric layer on the interfacial layer and on the second gate insulating material.

In one embodiment, the semiconductor device may further include an interlayer dielectric layer surrounding the fins.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
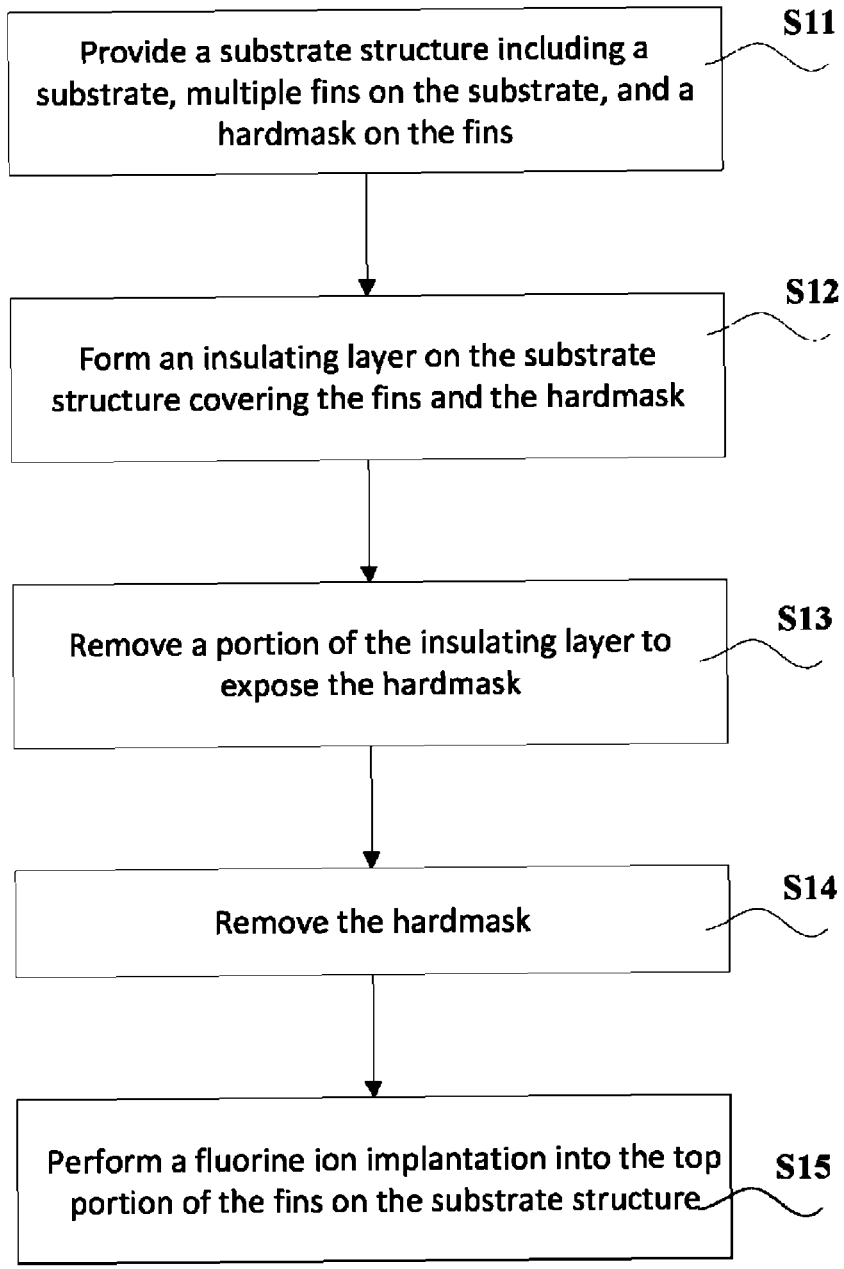
FIG. 1 is a simplified flowchart illustrating a method for manufacturing a semiconductor device according to various embodiments of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 is a simplified flowchart illustrating a method for manufacturing a semiconductor device according to various embodiments of the present invention. FIGS. 2 through 16 are schematic cross-sectional views of intermediate stages of a method for manufacturing a fin-type semiconductor device having improved gate dielectric quality according to embodiments of the present invention.

A method for manufacturing a fin-type semiconductor device will be described in more detail with reference to FIG. 1 and FIGS. 2 though 16. In accordance with the present invention, the method may include:

S11: providing a substrate structure. The substrate structure includes a substrate, one or more fins disposed on the substrate and separated from each other by shallow trench isolations, and a hardmask on the fins. Referring to FIG. 2, the substrate structure includes a substrate (e.g., a silicon substrate) 21, a plurality of fins on the substrate 21, and a hardmask 222 on the fins. For example, the fins may include silicon, and the hardmask may include silicon nitride.

Figure 2:
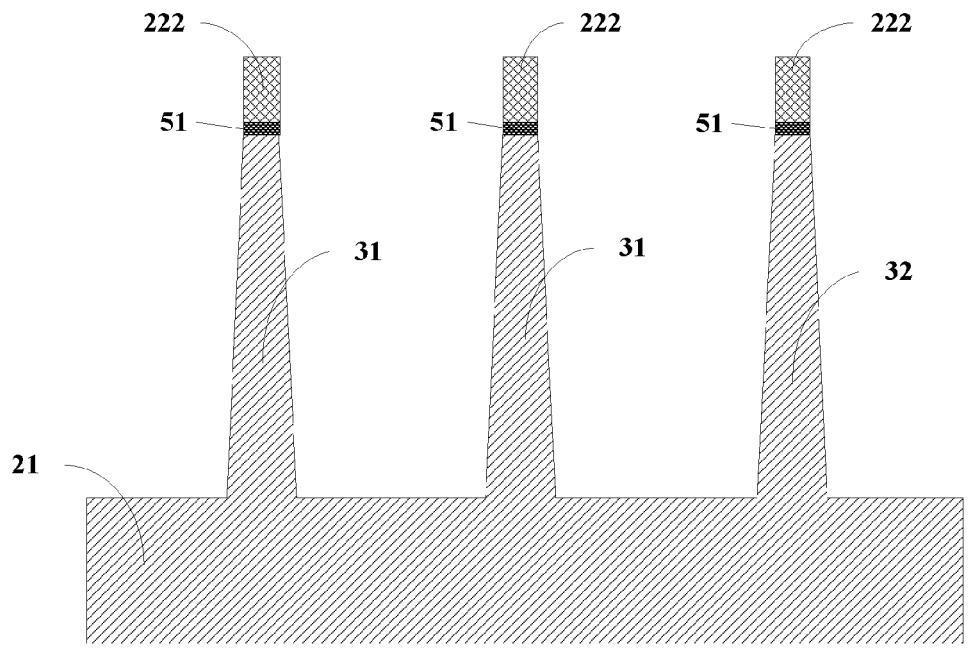
FIG. 2 is a schematic cross-sectional view of an intermediate structure of a semiconductor device in a stage of manufacture according to embodiments of the present invention.

In one embodiment, the fins may include a first set of fins 31 for forming core devices and a second set of fins 32 for forming input/output devices, as shown in FIG. 2. The first set and second sets of fins each may include any integer number of fins. In the example shown in FIG. 2, two fins are used in the first set and one fin is used in the second set. But it is understood that the number is arbitrary chosen for describing the example embodiment and should not be limiting.

In some embodiments, the substrate structure may also include a pad oxide layer 51 disposed between the hardmask and the top surface of the fins, as shown in FIG. 2.

Figure 3:
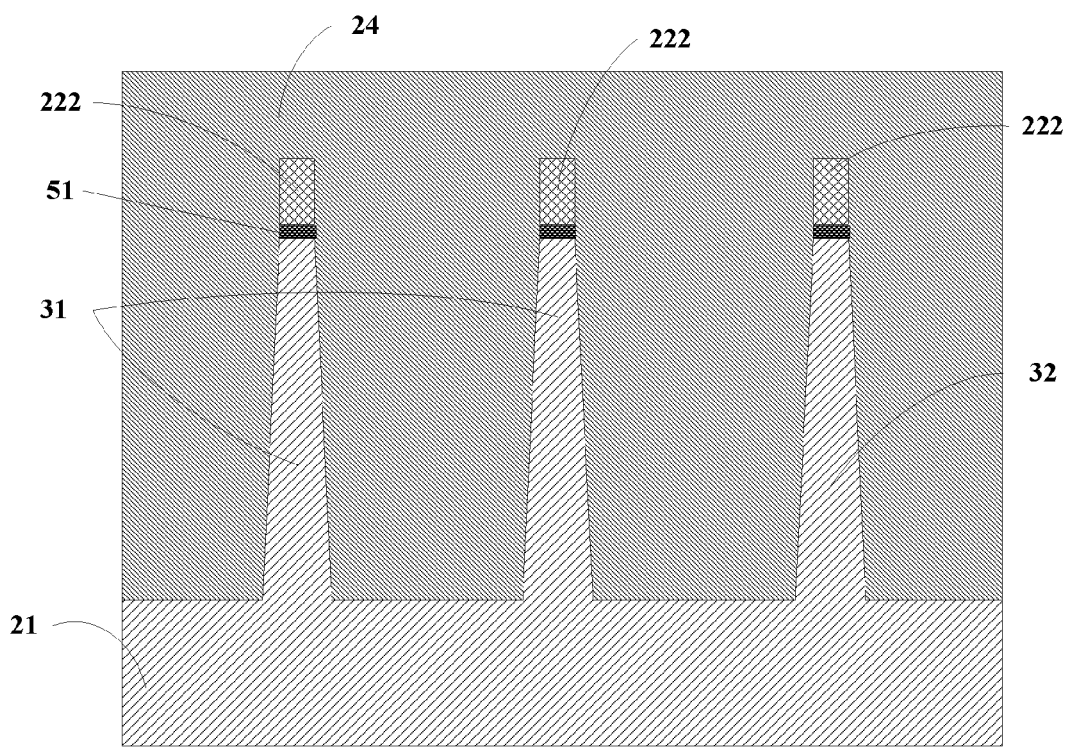
FIG. 3 is a schematic cross-sectional view of an intermediate structure of a semiconductor device in a stage of manufacture according to embodiments of the present invention.

S12: forming an insulating layer on the substrate structure to cover the fins and the hardmask. For example, an insulating layer 24 may be formed using a fluid chemical vapor deposition (FCVP) on the substrate to cover the hardmask and the fins, as shown in FIG. 3.

In some embodiments, prior to forming insulating layer 24, the method may also include forming an oxide liner (not shown) using an oxidation or oxide deposition process. The oxide liner can repair damage caused by the etching of the fins. The insulating layer is then formed on the oxide liner.

In some embodiments, after forming the insulating layer, the method may further include performing an annealing process on the substrate structure.

Figure 4:
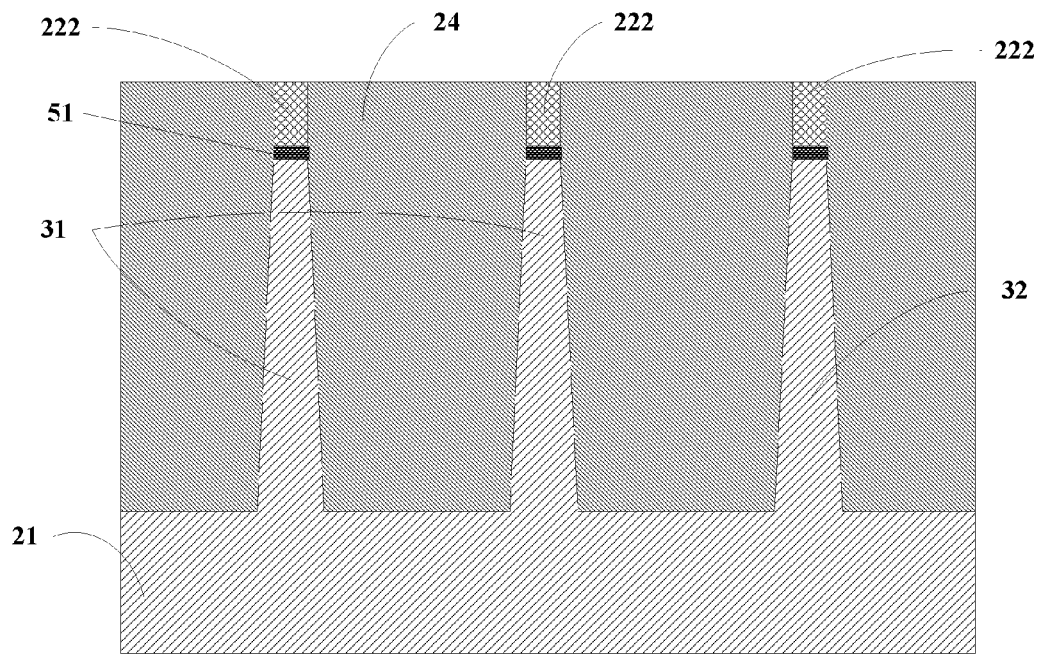
FIG. 4 is a schematic cross-sectional view of an intermediate structure of a semiconductor device in a stage of manufacture according to embodiments of the present invention.

S13: removing a portion of the insulating layer to expose a surface of the hardmask. Referring to FIG. 4, a chemical mechanical polishing (CMP) process is performed on insulating layer 24 until a surface of the hardmask is exposed.

Figure 5:
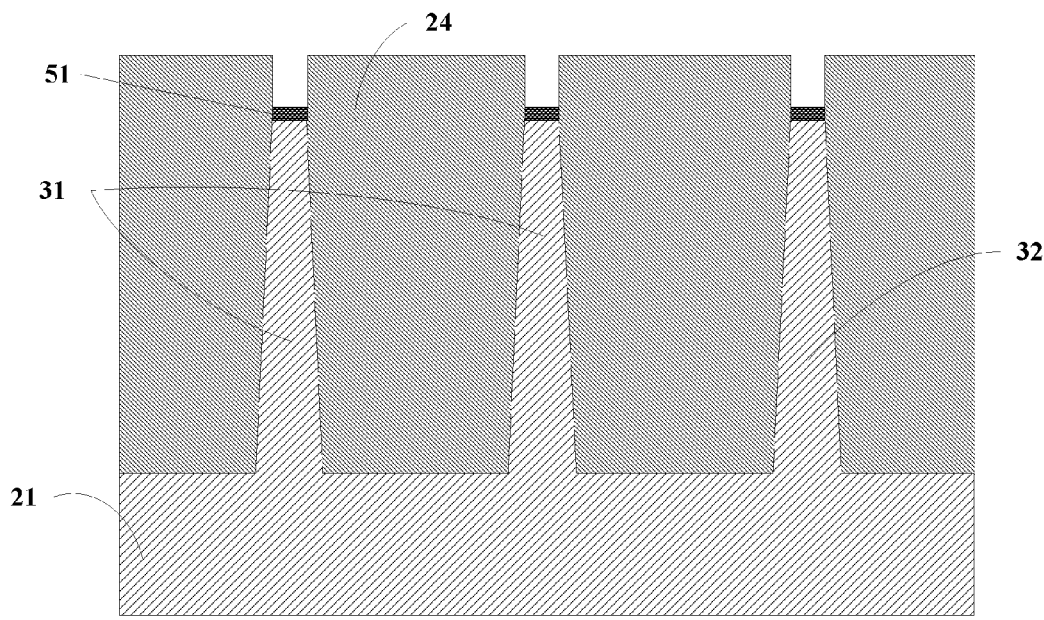
FIG. 5 is a schematic cross-sectional view of an intermediate structure of a semiconductor device in a stage of manufacture according to embodiments of the present invention.

S14: removing the hardmask. As shown in FIG. 5, hardmask 222 is removed.

Figure 6:
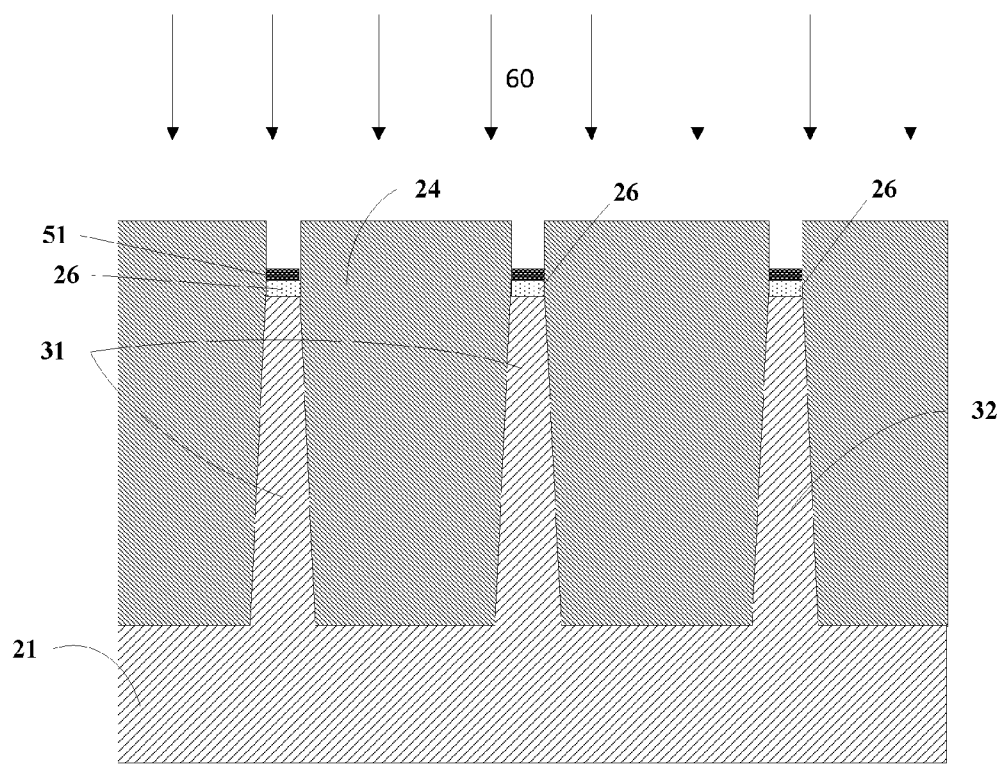
FIG. 6 is a schematic cross-sectional view of an intermediate structure of a semiconductor device in a stage of manufacture according to embodiments of the present invention.

S15: after the hardmask has been removed, a fluorine ion implantation is performed to implant fluorine ions (atoms) into the top portion of the fins on the substrate structure. For example, as shown in FIG. 6, a fluorine ion implantation 60 is performed on the substrate structure to implant fluorine ions into the top portion of the fins to form a fluorine doped portion 26.

In some embodiments, the fluorine ion implantation may be performed at an energy in the range between 2 keV and 10 keV and a dose in the range between $1.0 \times 10^{13}$ and $1.0 \times 10^{15}$ atoms/cm$^2$. In certain embodiments, the doped depth of the fluorine doped region 25 may be less than 3 nm, and the fluorine ion doping concentration in the doped region may be in the range between $1.0 \times 10^{17}$ and $1.0 \times 10^{21}$ atoms/cm$^3$.

Thus, a manufacturing method of a semiconductor device is provided according to some embodiments of the present invention. Since fluorine ions are implanted into the top portion of the fins, which passivate the fin top portion dangling bonds, in particular, the implanted fluorine ions provide a better passivation of the dangling bonds of the fin top portion of the fins in the core devices, thereby improving the performance and reliability of the semiconductor device.

Figure 7:
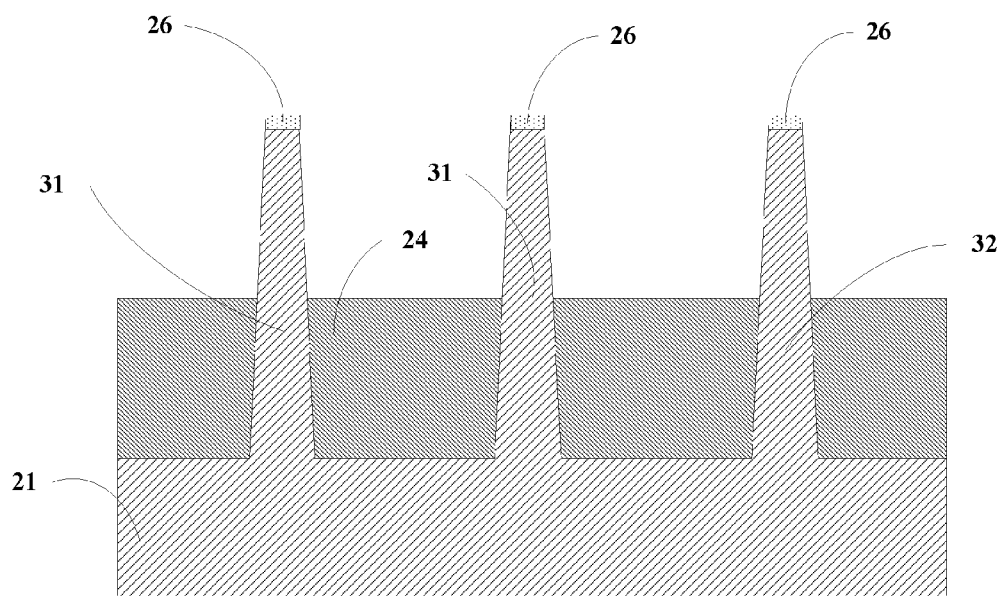
FIG. 7 is a schematic cross-sectional view of an intermediate structure of a semiconductor device in a stage of manufacture according to embodiments of the present invention.

In the embodiment, the method may further include forming a recess (trench) in insulating layer 24 to expose at least a portion of the fins, as shown in FIG. 7. For example, the recess may be formed by performing an etching process on the insulating layer. In one embodiment, forming the recess may also include the removal of pad oxide layer 51.

In the embodiment, the method may further include forming a first gate structure surrounding the exposed portion of the first set of fins and a second gate structure surrounding the exposed portion of the second set of fins. The first gate structure includes a first gate insulating material and a first gate electrode on the first gate insulating material, and the second gate structure includes a second gate insulating material and a second gate electrode on the second gate insulating material.

The process of forming the first and second gate structures is described in detail below with reference to FIGS. 8 to 11.

Figure 8:
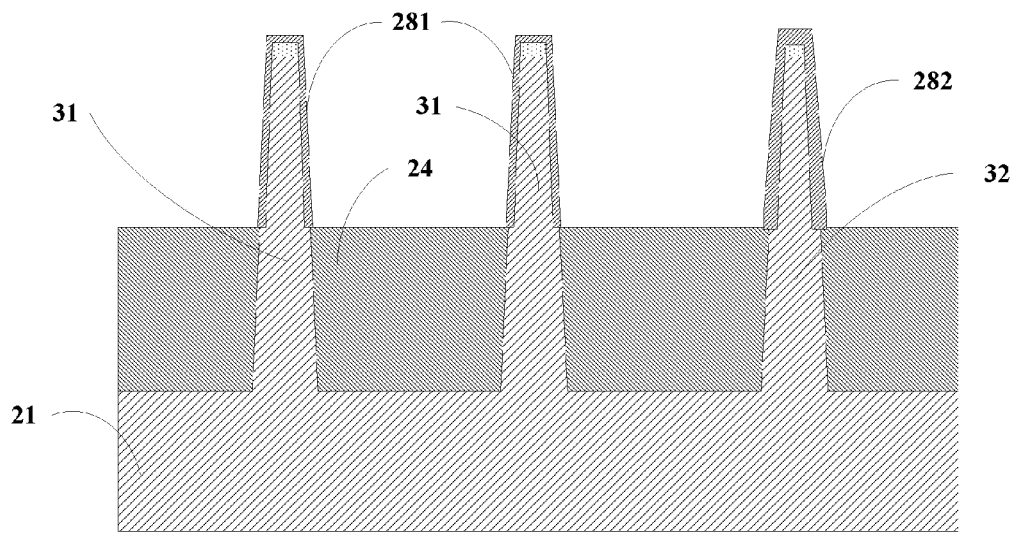
FIG. 8 is a schematic cross-sectional view of an intermediate structure of a semiconductor device in a stage of manufacture according to embodiments of the present invention.

Referring to FIG. 8, a first gate insulating material 281 is formed on the exposed portion of first set of fins 31, and a second gate insulating material 282 is formed on the exposed portion of second set of fins 32. For example, first and second gate insulating materials 281 and 282 may be silicon dioxide. In one embodiment, second gate insulating material 282 has a thickness that is greater than the thickness of first gate insulating material 281. For example, first and second gate insulating materials 281 and 282 may be formed using an oxidation process.

Thereafter, a patterned gate electrode may be formed on the structure shown in FIG. 8.

Figure 9:
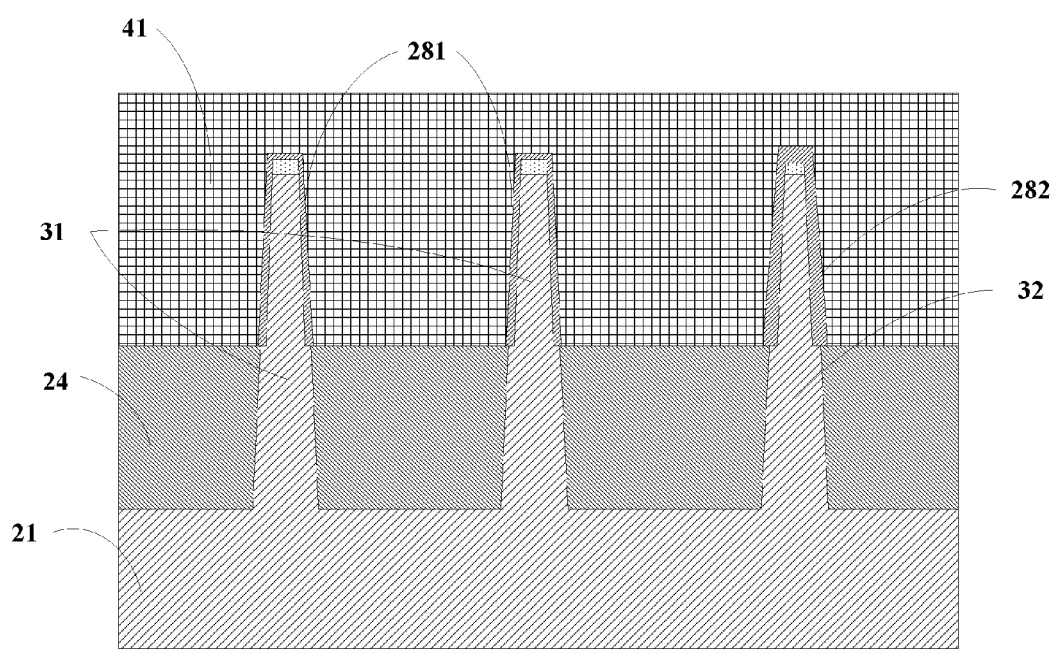
FIG. 9 is a schematic cross-sectional view of an intermediate structure of a semiconductor device in a stage of manufacture according to embodiments of the present invention.
Figure 10:
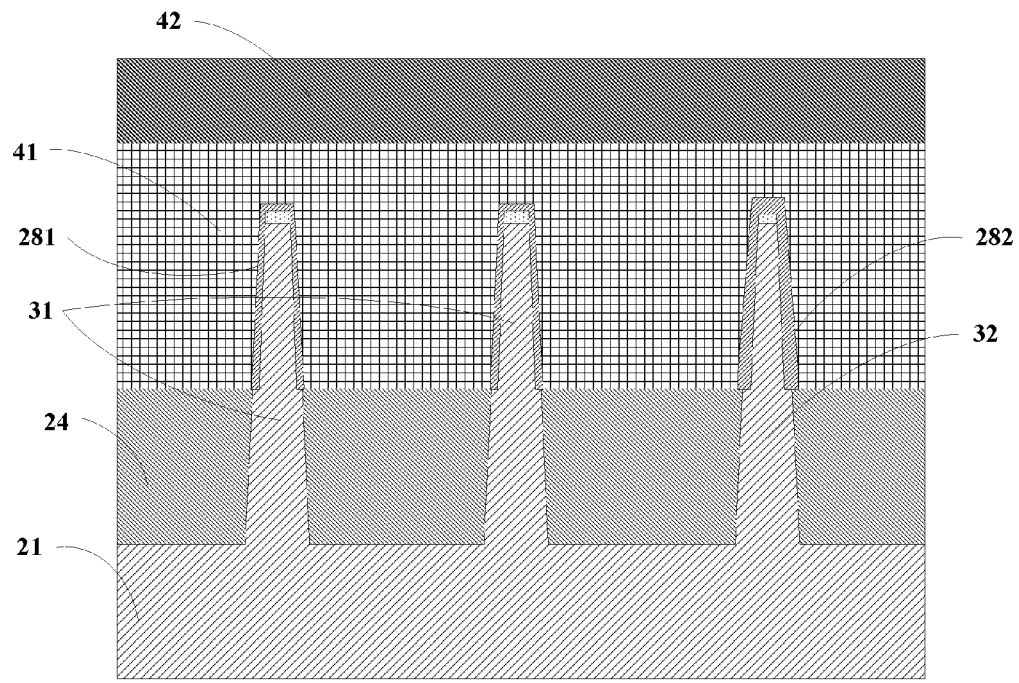
FIG. 10 is a schematic cross-sectional view of an intermediate structure of a semiconductor device in a stage of manufacture according to embodiments of the present invention.

Referring to FIG. 9, a gate electrode material 41 is formed on the substrate structure using a deposition process. The gate electrode material may be polysilicon but is not limited thereto.

Thereafter, a CMP process is performed on gate electrode material 41, and a hardmask (optional) 42 is formed on the planarized gate electrode material.

Figure 11:
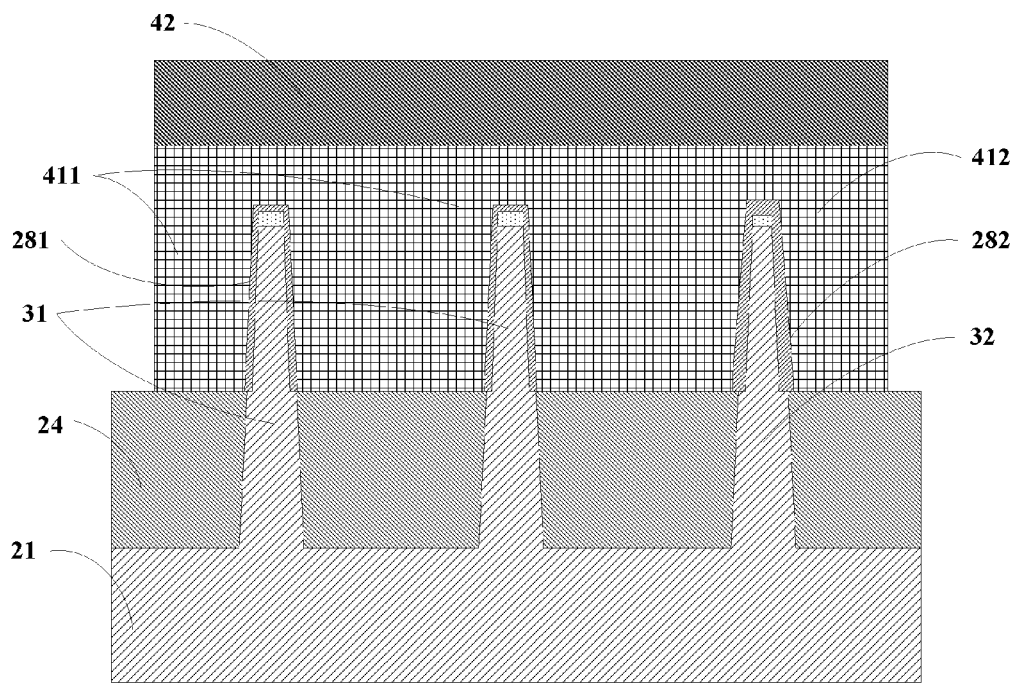
FIG. 11 is a schematic cross-sectional view of an intermediate structure of a semiconductor device in a stage of manufacture according to embodiments of the present invention.

Thereafter, the optional hardmask (if any) and the gate electrode material are removed by etching using a patterned mask (e.g., a patterned photoresist, not shown) to form a first gate 411 and a second gate 412, as shown in FIG. 11. It is noted that the first and second gates are shown as a single entity in some embodiments. In other embodiments, the first and second gates are separated from each other.

Thus, the first gate structure surrounding the exposed portion of the first set of fins and the second gate structure surrounding the exposed portion of the second set of fins are formed. The first gate structure includes first gate insulating material 281 and first gate 411, and the second gate structure includes second gate insulating material 282 and second gate 412.

In the embodiment of the present invention, the method may further include forming an interlayer dielectric layer surrounding the first and second gate structures while exposing a surface of the first and second gate structures. The method also includes removing the first and second gates, forming a patterned mask exposing the first gate insulating material of the first set of fins, and removing the first gate insulating material using the patterned mask as a mask to expose a portion of the first set of fins. The method further includes removing the patterned mask and forming a third gate insulating material on the exposed portion of the first set of fins and on the second gate insulating material of the second set of fins.

In some embodiments, the third gate insulating material may include an interfacial layer on the exposed portion of the first set of fins and a high-k (high dielectric constant) dielectric layer on the second gate insulating material of the second set of fins.

Figure 12:
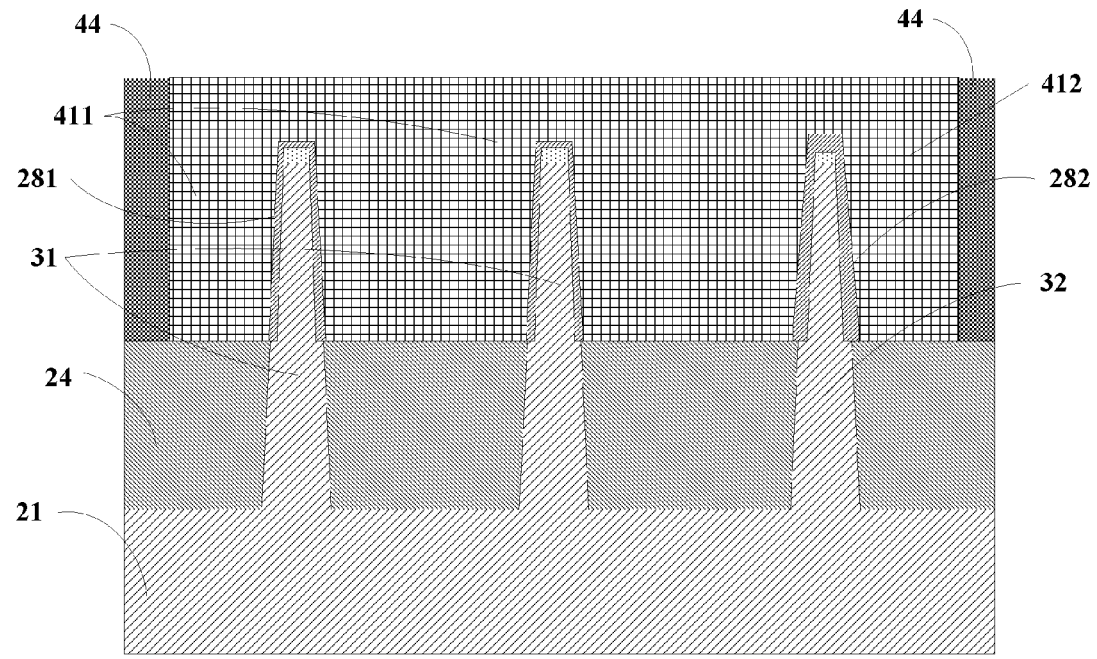
FIG. 12 is a schematic cross-sectional view of an intermediate structure of a semiconductor device in a stage of manufacture according to embodiments of the present invention.

Referring to FIG. 12, an interlayer dielectric layer 44 surrounds the first and second gate structures but exposes a surface of the first and second gate structures. For example, the interlayer dielectric layer can be formed using a deposition process on the structure shown in FIG. 11. A planarization (e.g., CMP) process is then performed on the interlayer dielectric layer to expose a surface of the first and second gate structures. In this step the hardmask 42 if present is also removed.

Figure 13:
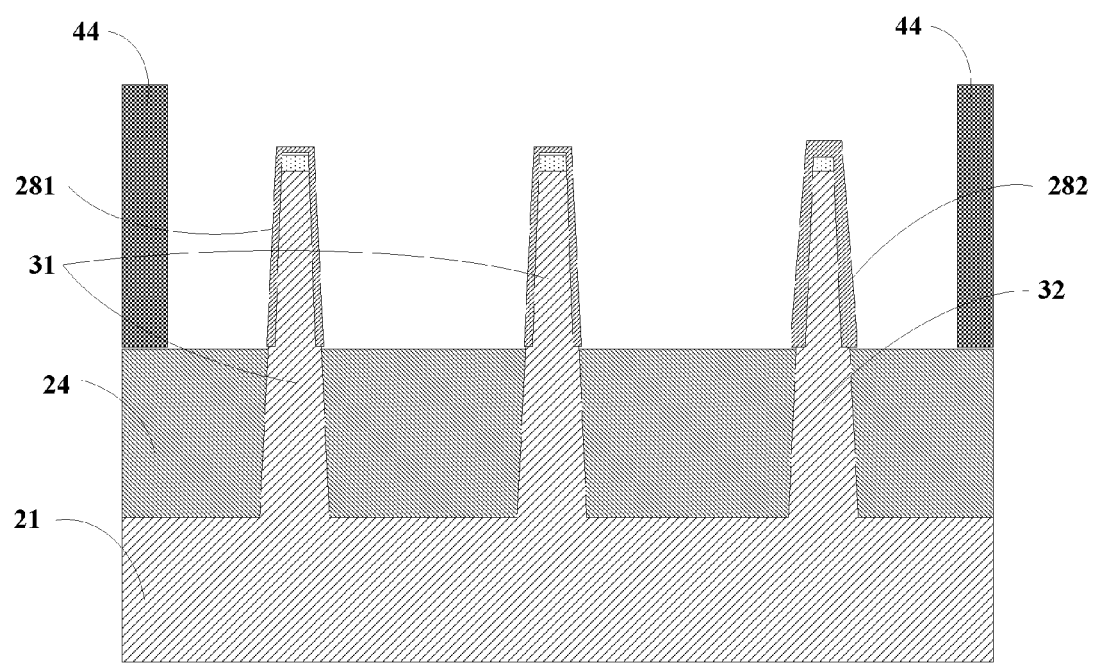
FIG. 13 is a schematic cross-sectional view of an intermediate structure of a semiconductor device in a stage of manufacture according to embodiments of the present invention.

Thereafter, first and second gates 411, 412 are removed, as shown in FIG. 13.

Figure 14:
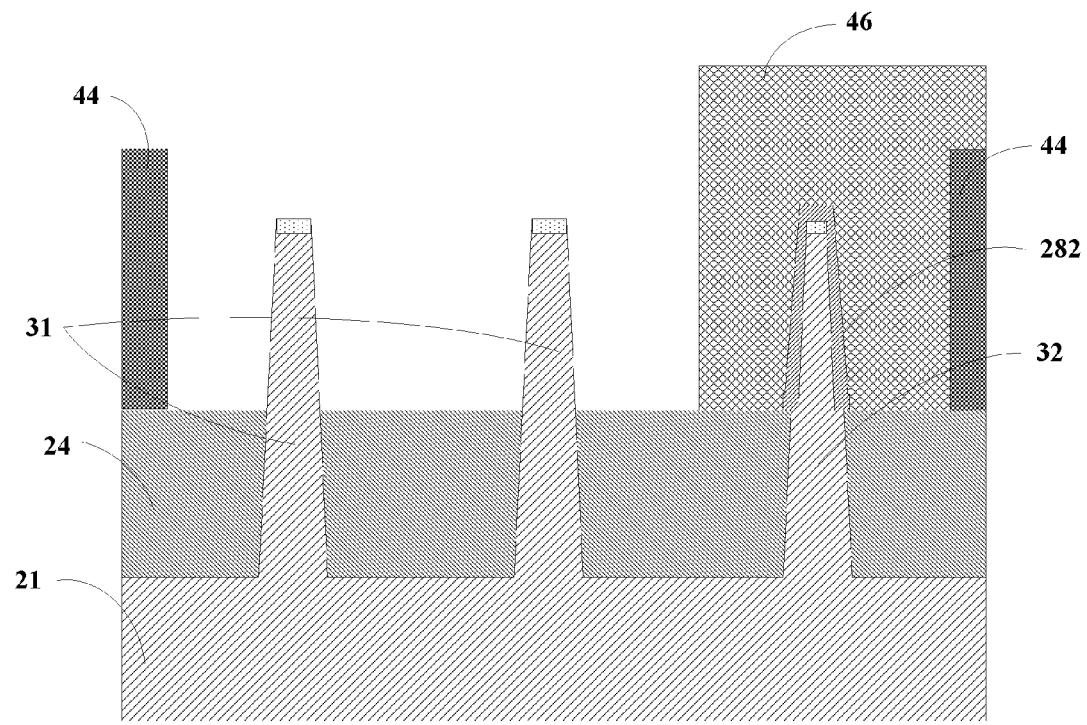
FIG. 14 is a schematic cross-sectional view of an intermediate structure of a semiconductor device in a stage of manufacture according to embodiments of the present invention.

Thereafter, a patterned mask 46 is formed on second set of fins 32 while exposing first gate insulating material 281 of the first set of fins. The first gate insulating material is then removed to expose a surface of the first set of fins, as shown in FIG. 14. Thereafter, patterned mask 46 is removed.

Figure 15:
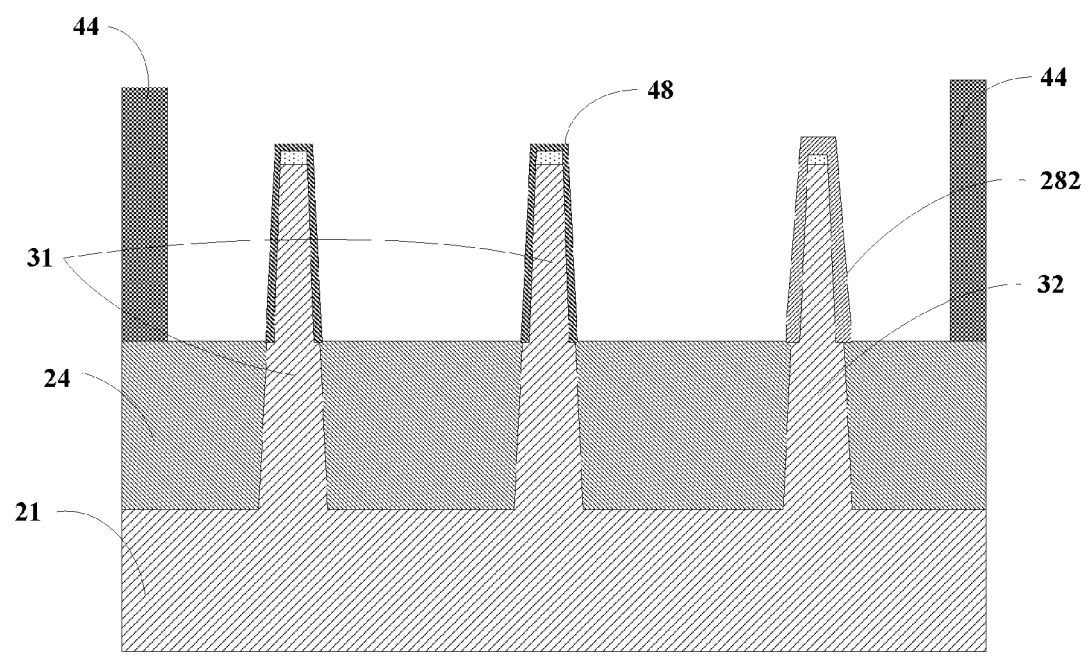
FIG. 15 is a schematic cross-sectional view of an intermediate structure of a semiconductor device in a stage of manufacture according to embodiments of the present invention.

Thereafter, an interfacial layer 48 is formed on the exposed surface of the first set of fins, as shown in FIG. 15. The interfacial layer may be formed using an oxidation process. For example, the interfacial layer may be a silicon dioxide layer. The interfacial layer may be used as a part of the gate insulating material. In some embodiments, interfacial layer 48 can be formed using a chemical oxidation process. In other embodiments, interfacial layer 48 can be formed using an in-situ steam generation (ISSG) process on the exposed surface of first set of fins 31 and on second gate insulating material 282 of second set of fins 32 (not shown).

Thereafter, a high-k dielectric layer 49 is formed on interfacial layer 48 and second gate insulating material 282 of second set of fins 32. Interfacial layer 48 and high-k dielectric layer 49 together form a third gate insulating material.

In other embodiments, if the interfacial layer is formed on the exposed surface of the first set of fins and on the second gate insulating material of the second set of fins in previous steps, then the high-k dielectric layer is formed on the interfacial layer in this step.

Thus, a manufacturing method of a semiconductor device is provided according to the embodiments of the present invention. Since the fluorine ions passivate the top portion of the fins, the quality of the interfacial layer (used as a part of the gate insulating material) and the high-k dielectric layer is improved, thereby improving the semiconductor device reliability, in particular, the reliability of the input/output devices.

In one embodiment, the method may further include performing an annealing process on the substrate structure after forming the third gate insulating material. The annealing process may further improves the quality of the gate insulating material on the top portion of the fins and thus the reliability of the gate insulating material.

Figure 16:
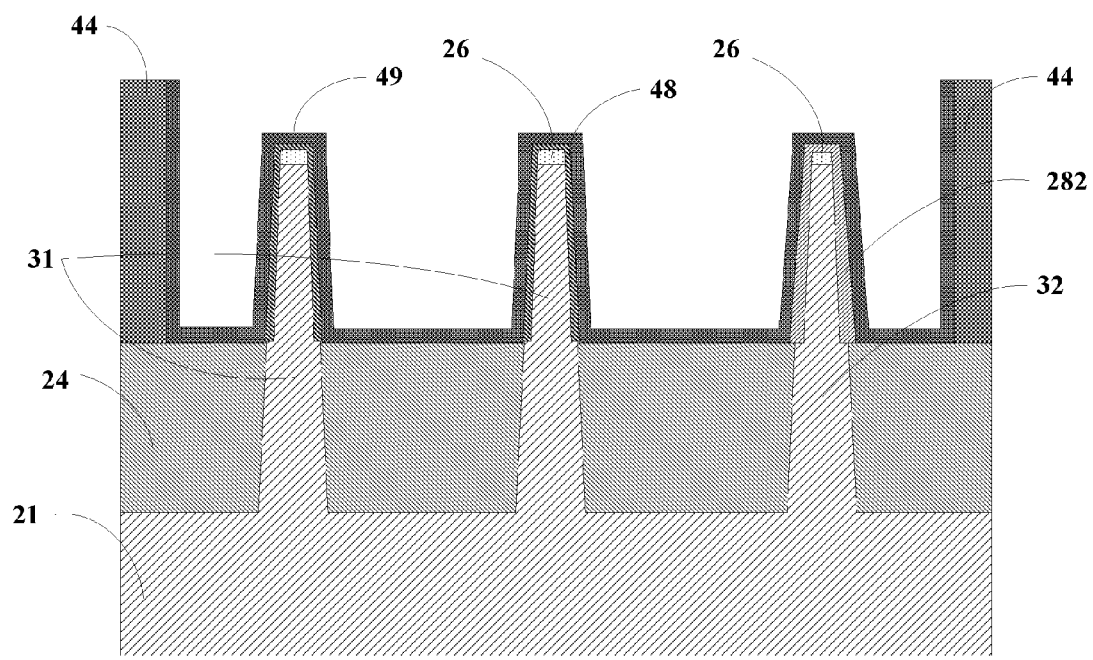
FIG. 16 is a schematic cross-sectional view of an intermediate structure of a semiconductor device in a stage of manufacture according to embodiments of the present invention.

Embodiments of the present invention also provide a semiconductor device. Referring to FIG. 16, the semiconductor device may include a substrate structure that includes a substrate 21, a plurality of fins 31, 32 on the substrate, and a fluorine doped portion 26 on the top portion of the fins.

The fluorine doped region passivate dangling bonds of the top portion of the fins, in particular, the dangling bonds on the interfacial layer of the core devices, thereby improving the device reliability.

In one embodiment, the fluorine ion implantation may be performed at an energy in the range between 2 keV and 10 keV, and a dose in the range between $1.0\times10^{13}$ and $1.0\times10^{15}$ atoms/cm$^2$. In certain embodiments, the fluorine-doped top portion has a depth less than 3 nm, and a dopant concentration is in the range between $5.0\times10^{17}$ and $5.0\times10^{21}$ atoms/cm$^3$. Of course, those skilled in the art will recognize that other proper process conditions may exist.

Referring still to FIG. 16, first set of fins 31 may be used as a part of core devices and second set of fins may be used as a part of input/output (I/O) devices according to one embodiment of the present invention. For example, a fin of the first set of fins is a portion of a FinFET device in the core region, and a fin of the second set of fins is a portion of a FinFET device in the input/output region.

In the embodiment, the semiconductor device may also include a second gate insulating material 282 surrounding an exposed portion of second set of fins 32, and a third gate insulating material surrounding an exposed surface of first set of fins 31 and second gate insulating material 282 of second set of fins 32.

In some embodiments, the third gate insulating material may include an interfacial layer 48 formed on the exposed surface of first set of fins 31, and a high-k dielectric layer 49 on interfacial layer 48 and second gate insulating material 282 of second fins 32.

In other embodiments, the third gate insulating material may further include an interfacial layer on the exposed surface of the first set of fins and the second gate insulating material of the second set of fins, and a high-k dielectric layer on the interfacial layer.

In one embodiment, the semiconductor device may also include a gate electrode disposed on the high-k dielectric layer and source/drain regions on opposite sides of the gate electrode (not shown). The location, shape of the source/drain regions adjacent to the gate electrode are apparent to those of skill in the art and will not be described herein for the sake of brevity.

Thus, a method for manufacturing semiconductor device and a semiconductor device manufactured using the method have been described in accordance with the present invention.

In order not to obscure the inventive concepts of the disclosure, well-known elements and fabrication techniques have not been described in detail. In other instances, specific details have been provided in order to provide a thorough understanding of the inventive concepts and a description of the embodiments of the invention. However, it will be obvious to one skilled in the art that the described inventive concepts may be employed without these specific details.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
    providing a substrate structure comprising a substrate, a plurality of fins comprising a first fin and a second fin on the substrate, a pad oxide layer on the fins, and a hardmask on the pad oxide layer;
    forming an insulating layer on the substrate structure covering the fins, the pad oxide layer, and the hardmask;
    removing a portion of the insulating layer by etching to expose the hardmask;
    removing the hardmask while retaining the pad oxide layer; and
    performing a fluorine ion implantation only into a top portion of the fins through the pad oxide layer;
    forming a recess in the insulating layer exposing a portion of the first fin and a portion of the second fin;
    forming a first gate insulating material layer on the exposed portion of the first fin; and
    forming a second gate insulating material layer on the exposed portion of the second fin, the second gate insulating material layer having a thickness greater than a thickness of the first gate insulating material layer.

2. The method of claim 1, wherein the fluorine ion implantation comprises:
    implanting fluorine ions at an energy in a range between 2 KeV and 10 KeV using a dose in a range between $1\times10^{13}$ and $1\times10^{15}$ atoms/cm$^2$.

3. The method of claim 1, wherein the first fin is a portion of a core device and the second fin is a portion of an I/O device.

4. The method of claim 1, further comprising:
    forming a first gate structure surrounding the exposed portion of the first fin and a second gate structure surrounding the exposed portion of the second fin,
    wherein the first gate structure comprises the first gate insulating material layer on the exposed portion of the first fin and a first gate on the first gate insulating material, and
    wherein the second gate structure comprises the second gate insulating material layer on the exposed portion of the second fin and a second gate on the second gate insulating material layer.

5. The method of claim 4, further comprising:
forming an interlayer dielectric layer surrounding the first and second gate structures;
performing a chemical physical polishing process on the interlayer dielectric layer to expose a surface of the first and second gate structures;
removing the first gate and the second gate;
forming a patterned mask on the second gate structure while exposing the first gate insulating material layer on the first fin;
removing the first gate insulating material layer to expose a surface of the first fin;
removing the patterned mask;
forming a third dielectric material on the exposed surface of the first fin and on the second gate insulating material layer of the second fin.

6. The method of claim 5, wherein forming the third dielectric material comprises:
forming an interfacial layer on the exposed surface of the first fin; and
forming a high-k dielectric layer on the interface layer of the first fin and on the second gate insulating material layer of the second fin.

7. The method of claim 1, further comprising:
forming a gate electrode material layer on the first and second gate insulating material layers;
removing a portion of the gate electrode material layer to form a first gate on the first gate insulating material layer and a second gate on the second gate insulating material layer;
wherein the first gate and the first gate insulating material layer together form a first gate structure;
wherein the second gate and the second gate insulating material layer together form a second gate structure.

8. The method of claim 7, further comprising:
forming an interlayer dielectric layer surrounding the first and second gate structures while exposing an upper surface of the first and second gate structures.

9. The method of claim 8, further comprising:
removing the first gate exposing the first gate insulating material layer and the second gate exposing the second gate insulating material layer;
forming a patterned mask on the exposed second gate insulating material layer while exposing the first gate insulating material layer;
removing the first gate insulating material layer to expose a surface of the first fin; and
removing the patterned mask to expose the second gate insulating material layer.

10. The method of claim 9, further comprising:
forming an interfacial layer on the exposed surface of the first fin and on the exposed second gate insulating material layer using an in-situ steam generation process; and
forming a high-k dielectric layer on the interfacial layer.

* * * * *